United States Patent [19]

Coady et al.

[11] Patent Number: 5,475,263
[45] Date of Patent: Dec. 12, 1995

[54] THICK FILM HYBRID MULTILAYER CIRCUIT

[75] Inventors: Michael G. Coady; Keith E. Ewing, both of Kokomo, Ind.

[73] Assignee: Delco Electronics Corp., Kokomo, Ind.

[21] Appl. No.: 195,430

[22] Filed: Feb. 14, 1994

[51] Int. Cl.[6] .................................................. H01L 23/12
[52] U.S. Cl. .......................... 257/700; 257/701; 257/717; 257/724; 257/778; 257/713
[58] Field of Search ..................................... 257/778, 701, 257/724, 700, 717, 713, 721, 722, 758; 361/720

[56] References Cited

U.S. PATENT DOCUMENTS

| | | | |
|---|---|---|---|
| 4,322,778 | 3/1982 | Barbow et al. | 257/724 |
| 4,698,663 | 10/1987 | Sugimoto et al. | 357/81 |
| 4,794,093 | 12/1988 | Zong et al. | 437/203 |
| 4,970,577 | 11/1990 | Ogihara et al. | 257/701 |
| 5,108,955 | 4/1992 | Ishida et al. | 437/214 |
| 5,139,973 | 8/1992 | Nagy et al. | 437/211 |
| 5,169,805 | 12/1992 | Mok et al. | 437/214 |
| 5,179,039 | 1/1993 | Ishida et al. | 437/212 |
| 5,182,632 | 1/1993 | Bechtel et al. | 257/713 |

*Primary Examiner*—William Mintel
*Assistant Examiner*—Roy Potter
*Attorney, Agent, or Firm*—Mark A. Navarre

[57] ABSTRACT

A thick film hybrid multilayer circuit is provided in which circuit devices are electrically interconnected with a multilayer structure composed of multiple layers of conductors interlaid with layers of a dielectric material in order to achieve high component density. The circuit devices of the hybrid circuit are directly mounted to a substrate, with the multilayer conductor-dielectric structure being located on an opposite surface of the substrate so as to insulate the multilayer conductor-dielectric structure from the circuit devices. As such, the multilayer conductor-dielectric structure, which is inherently weaker than the substrate, is relatively insulated from the adverse effects caused by thermal cycling during the operation of the hybrid circuit, so as to reduce the likelihood of cracks developing in the dielectric material within the multilayer conductor-dielectric structure.

13 Claims, 2 Drawing Sheets

THICK FILM HYBRID MULTILAYER CIRCUIT

The present invention generally relates to thick film hybrid multilayer circuits in which circuit devices are electrically interconnected with a multilayer structure composed of multiple conductor layers interlaid with multiple dielectric layers in order to achieve high component density. More particularly, this invention relates to a thick film hybrid multilayer circuit in which the circuit devices are directly mounted to a substrate, with the multilayer structure being located on an opposite surface of the substrate so as to insulate the multilayer structure from the adverse effects caused by thermal cycling during circuit operation.

BACKGROUND OF THE INVENTION

In the construction of a thick film hybrid circuit, it is generally desirable to position the circuit components of the circuit as close to each other as possible, resulting in a higher component density, so as to minimize the size of the hybrid circuit. As shown in FIG. 1, one known method for achieving a high component density for a thick film hybrid circuit 110 is to place conductors, which make electrical interconnects between circuit devices 22a–c and 24, within a multilayer structure composed of layers of metal runners 14 interlaid with layers 16 of an electrically insulating, or dielectric, material. Successive layers of metal runners 14 are electrically insulated from each other with an intermediate layer 16 of the dielectric material, with metallized holes, or vias 18, being provided to electrically interconnect appropriate metal runners 14 with the circuit devices' corresponding bond pads 20 on the surface of the multilayer structure. Metallized vias 18 are also provided to electrically interconnect successive layers of metal runners 14 where necessary. The multilayer structure is then adhered to the surface of a suitable substrate 12 which provides the structural support for the hybrid circuit 110. A heat sink 26 is typically adhered to the lower surface of the substrate 12 by which heat generated by the circuit devices 22a–c and 24 is conducted away from the hybrid circuit 110.

While the above approach is highly desirable from the standpoint of maximizing component density, significant disadvantages exist. A primary disadvantage is that heat generated by the circuit devices 22a–c and 24 must be conducted through the multilayer structure, which typically will have a higher thermal resistance than the substrate 12 and heat sink 26. Consequently, heat is not as readily conducted away from the circuit devices 22a–c and 24, resulting in higher operating temperatures. Furthermore, when using certain bonding technologies, such as soldering, adhesion of the circuit devices 22a–c and 24 to the exposed dielectric layer 16 of the multilayer structure is not as reliable as directly attaching the circuit devices 22a–c and 24 to the substrate 12.

Yet another shortcoming with the hybrid circuit 110 of the prior art is the inherent structural weakness of the dielectric layers 16, particularly when subjected to stresses induced during thermal cycling of the hybrid circuit 110. Thermal gradients resulting from heat generated by large surface mounted devices, such as flip chip integrated circuits 22a, chip-and-wire integrated circuits 22b, and capacitors, resistors and inductors 22c, have a tendency to create cracks 28 through the dielectric layers 16, which has the potential for creating an open circuit within the hybrid circuit 110.

Accordingly, what is needed is a thick film hybrid circuit which utilizes a multilayer conductor-dielectric structure in order to enhance the component density of the hybrid circuit, while also overcoming the significant disadvantages and shortcomings of the prior art. For example, such a hybrid circuit would promote the conduction and diffusion of heat generated by the circuit devices, enable a more reliable method for attaching the circuit devices, and reduce the thermal gradients which promote the formation of cracks within the dielectric material used in the multilayer structure by thermally insulating the multilayer structure from large circuit devices.

SUMMARY OF THE INVENTION

It is an object of this invention to provide a thick film hybrid multilayer circuit which is configured to thermally insulate its multilayer conductor-dielectric structure from the circuit devices of the hybrid circuit.

It is a further object of this invention that the hybrid circuit's circuit devices are mounted to a substrate, instead of the multilayer structure, so as to promote the conduction and diffusion of heat generated by the circuit devices.

It is another object of this invention that the multilayer structure be insulated from the circuit devices by being supported on a surface of the substrate opposite the circuit devices.

It is another object of this invention that the hybrid circuit provide for electrical interconnection of the circuit devices with the multilayer structure.

In accordance with a preferred embodiment of this invention, these and other objects and advantages are accomplished as follows.

According to the present invention, there is provided a thick film hybrid multilayer circuit characterized by circuit devices which are electrically interconnected with a multilayer structure composed of multiple layers of conductors interlaid with layers of a dielectric material in order to achieve high component density. The circuit devices of the hybrid circuit are mounted directly to a substrate, with the multilayer structure being located on an opposite surface of the substrate so as to insulate the multilayer structure from the circuit devices. As a result, the multilayer structure, which is inherently weaker than the substrate, is relatively insulated from the adverse effects caused by thermal cycling during the operation of the hybrid circuit, so as to reduce the likelihood for cracks to develop in the dielectric material within the multilayer structure.

Generally, the substrate of the hybrid circuit has a pair of oppositely disposed surfaces. Mounted to one of the surfaces is the multilayer structure, which is composed of multiple layers of conductors interlaid with multiple layers of an electrically insulating, or dielectric, material. Circuit components are supported on the opposite surface of the substrate, and are electrically interconnected with the conductors within the multilayer structure through the substrate. Most preferably, the circuit components are electrically connected to the conductors with a conductive material which extends through vias in the substrate. To promote conduction of heat away from the hybrid circuit, a heat sink is preferably abutted against the multilayer structure such that the multilayer structure is between the substrate and the heat sink.

With the above structure, the substrate provides thermal insulation between the circuit components and the multilayer structure, so as to protect the multilayer structure from localized hot spots created by the circuit components. As a result, the multilayer structure is less susceptible to the adverse effects caused by thermal cycling during the operation of the hybrid circuit, and is therefore less likely to crack. Due to its multiple layered construction and the presence of the dielectric material within the multilayer structure, the thermal resistance to heat conducted through the multilayer structure is significantly greater than the thermal resistance through the substrate. In that the substrate more readily conducts, and therefore more readily diffuses, heat generated by the circuit devices, a more uniform thermal gradient is generated over the surface area of the substrate. As such, hybrid circuits structured in accordance with this invention have the advantage of being more readily able to conduct heat away from the circuit components, resulting in lower operating temperatures for the components.

Another advantage of this invention is that the circuit components can be more reliably bonded to the substrate than to the multilayer structure when utilizing certain bonding techniques, such as soldering. Consequently, the reliability of the entire hybrid circuit is further promoted by permitting the circuit components to be bonded to the substrate, as is made possible with the present invention, instead of the multilayer structure, as practiced in the prior art. An added benefit of the hybrid circuit structure of this invention is that thick film resistors can be formed within the multilayer structure or between the multilayer structure and the substrate, such that component density is further promoted on the surface of the substrate. Placing the resistors within the multilayer structure, and therefore closer to the heat sink, enhances heat conduction from the resistors to the heat sink.

Another advantage of this invention is that the thick film hybrid multilayer circuit can be formed using known processing methods, such as well known printing, trimming, soldering and reflow techniques used in the electronics industry. As a result, hybrid circuits of this invention can be readily mass produced for use in such industries as the automotive industry.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

Figure 2:
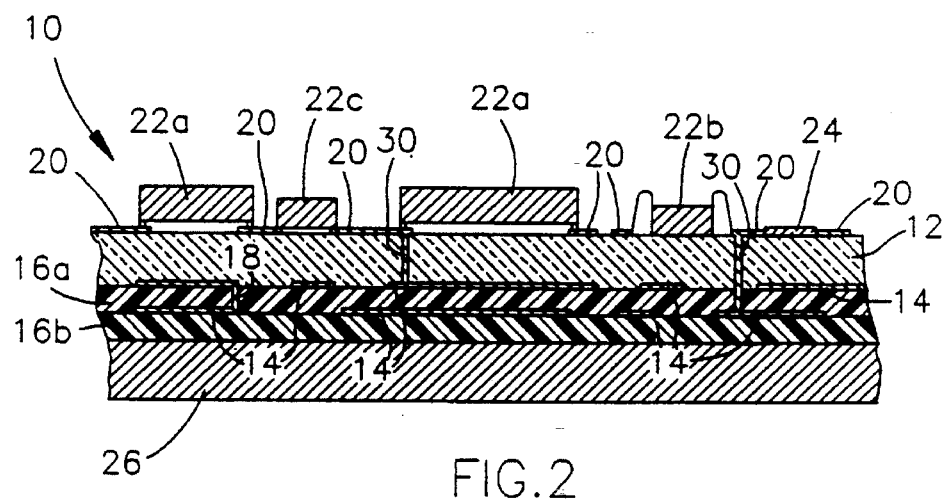
FIGS. 2 through 5 are cross-sectional views of various preferred embodiments of a thick film hybrid multilayer circuit in accordance with this invention.

A thick film hybrid multilayer circuit 10 in accordance with a first embodiment of this invention is shown in FIG. 2. The hybrid multilayer circuit 10 is characterized by circuit devices 22a–c and 24 which are electrically interconnected with a multilayer structure composed of multiple layers of conductors, or runners 14, interlaid with layers 16a and 16b of a dielectric material, in order to achieve a high component density. While the multilayer structure is shown as being composed of only two pairs of conductor-dielectric layers, those skilled in the art will recognize that numerous layers can be utilized, as necessitated by the particular application. Represented in FIG. 2 are surface mount devices such as flip chip integrated circuits 22a, chip-and-wire integrated circuits 22b, and capacitors, resistors and inductors 22c, while the circuit device 24 represents a thick film printed resistor 24. As is conventional, the circuit devices 22a–c may be secured to conductive metal pads 20 with a solder, or bonded in place with a conductive epoxy (not shown).

In accordance with a preferred aspect of this invention, the circuit devices 22a–c and 24 of the hybrid circuit 10 are not directly mounted to the multilayer structure, as is conventionally done in the prior art, but instead are mounted to the hybrid circuit's substrate 12. The substrate 12 is preferably formed from a ceramic material, such as an alumina ceramic of the type often utilized in the electronics industry. The multilayer structure is located on a surface of the substrate 12 opposite the circuit devices 22a–c and 24. As a result, the substrate 12 serves to insulate the multilayer structure from the circuit devices 22a–c and 24. Furthermore, the substrate 12 serves as a more suitable thermal conductor for the heat generated by the circuit devices 22a–c and 24. Due to its multiple layered construction and the presence of the dielectric layers 16a and 16b within the multilayer structure, the thermal resistance to heat conducted through the multilayer structure is significantly greater than the thermal resistance of the substrate 12. Because the substrate 12 can more readily conduct, and is therefore more readily able to diffuse, heat generated by the circuit devices 22a–c and 24, a more uniform temperature gradient is generated within the substrate 12 and the multilayer structure.

In order to electrically interconnect the circuit devices 22a–c and 24 to the runners 14 within the multilayer structure, metallized vias 30 are formed through the substrate 12. As is conventional, metallized vias 18 are also formed through the multilayer structure in order to appropriately interconnect successive layers of runners 14. As shown, an intermediate layer 16a of dielectric material electrically insulates the two layers of runners 14 shown, while a second layer 16b serves as an insulating layer between the multilayer structure and a heat sink 26. The heat sink 26 can be bonded directly to the second dielectric layer 16b with a suitable adhesive, such as an epoxy or a room temperature vulcanizing (RTV) rubber. While it has been previously noted that the dielectric layers 16a and 16b are not as structurally strong as the substrate 12, the large surface area available by which the heat sink 26 can be attached to the second dielectric layer 16b is able to provide more than adequate strength for most applications.

As a result of the above structure, the multilayer structure, which is structurally weaker than the substrate 12, is relatively insulated from the adverse effects caused by thermal cycling during the operation of the hybrid circuit. More specifically, the substrate 12 thermally insulates the multilayer structure from localized hot spots created by the circuit devices 22a–c and 24, in that the substrate 12 is able to more readily conduct heat so as to achieve a more uniform temperature gradient over its surface. As a result, the multilayer structure is less susceptible to cracking due to extreme thermal cycling conditions, as well as excessive temperature gradients within the multilayer structure. Because the substrate 12 is more readily able to conduct heat away from the circuit devices 22a–c and 24 than the multilayer structure, the operating temperatures for the circuit devices 22a–c and 24 are also lower, further promoting reliability of the hybrid circuit 10. An added benefit of the above structure is that the surface mount circuit devices 22a–c can be more reliably soldered to the substrate 12 than to the multilayer structure, thereby further promoting the reliability of the entire hybrid circuit.

The hybrid circuit 10 of this invention can be formed using known processing methods, such as printing, trimming, soldering and reflow techniques used in the electronics industry, so as to be highly suited for mass production. In that such processes are well known to those skilled in that art, the method for forming the hybrid circuit 10 will be summarized without reference to detailed processing parameters, such as temperatures and durations.

A preferred process flow for the manufacture of the hybrid circuit 10 begins with the selection of a material for the substrate 12. As noted above, alumina ceramic materials are highly suitable for purposes of this invention, though other materials could foreseeably be used. Prior to further processing, the vias 30 are formed through the substrate 12 using any suitable technique, such as green punching or laser drilling. A first layer of runners 14 is then printed and fired on one surface of the substrate 12, hereinafter referred to as the backside of the substrate 12. Conventional printing inks and firing techniques known to those skilled in the art are suitable for this step. Metallization of the vias 30 can be performed prior to or simultaneously during the printing of the first layer of runners 14. A layer 16a of a suitable dielectric material is then formed over the first layer of conductors 13. An example of such a dielectric material is a glass-ceramic formulation identified as DuPont 5707, available from the DuPont Company of Wilmington, Del. As with the conductor, the dielectric layer 16a can be deposited as an ink using known printing and firing techniques. With each successive layer, the vias 18 through the multilayer structure must be formed within the dielectric layers 16a and 16b, and may be created either by appropriately masking during the printing process and/or by etching during processing. Alternatively, the dielectric layer 16a can be applied as a tape dielectric, in a manner known in the prior art. With this approach, the vias 18 are formed in the tape with a mechanical punch, a laser, or a chemical patterning approach. After laminating the tape dielectric to the backside of the substrate 12, the vias 18 can be filled with metallization. With either approach, successive alternating layers of runners 14 and dielectrics 16 can be further deposited as required by the particular application to form a multilayer structure, such as that shown in FIG. 2.

The metal pads 20 are then formed on the opposite side of the substrate 12, hereinafter referred to as the top side of the substrate 12, again using known printing inks and printing and firing techniques. If required, the thick film resistor 24 is also printed and fired at this time, and then appropriately trimmed so as to achieve the desired resistance value. Next, the surface mount devices 22a–c are mounted to the substrate 12 by printing solder at the metal pads 20, positioning the devices 22a–c, and then reflowing the solder to bond the devices 22a–c to their respective metal pads 20. As a final step to forming the hybrid circuit 10 of this invention, the heat sink 26 is attached to the last dielectric layer 16b of the multilayer structure using any suitable method, such as with a thermally conductive adhesive.

Figure 3:
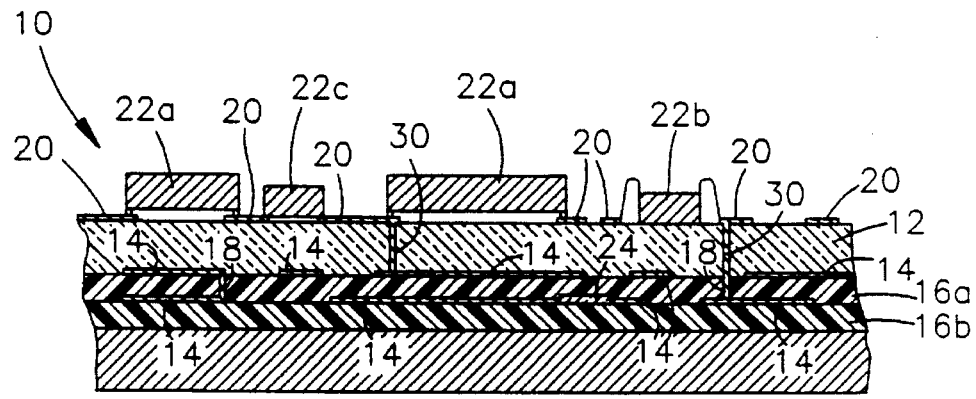
Figure 4:
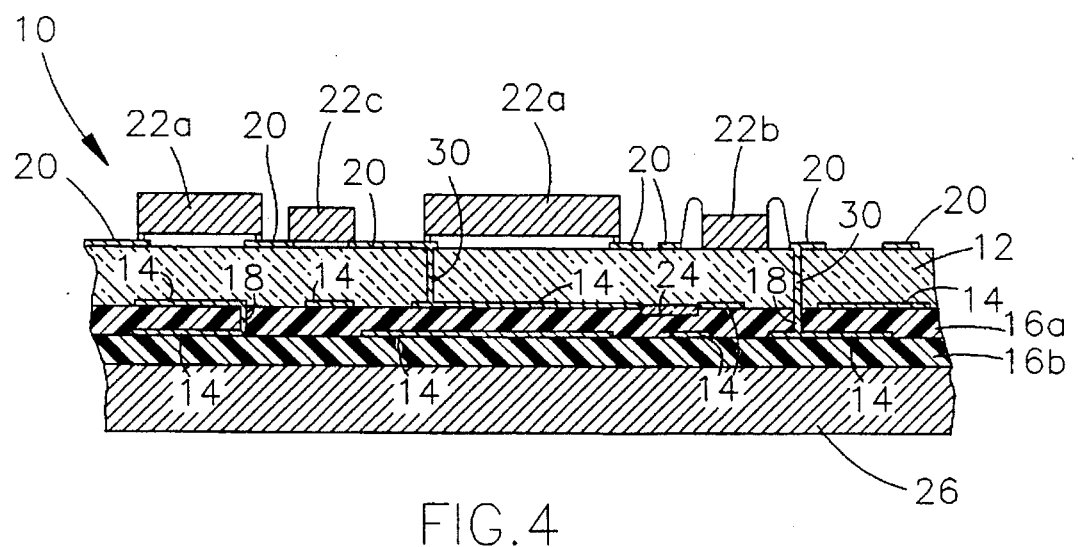
Figure 5:
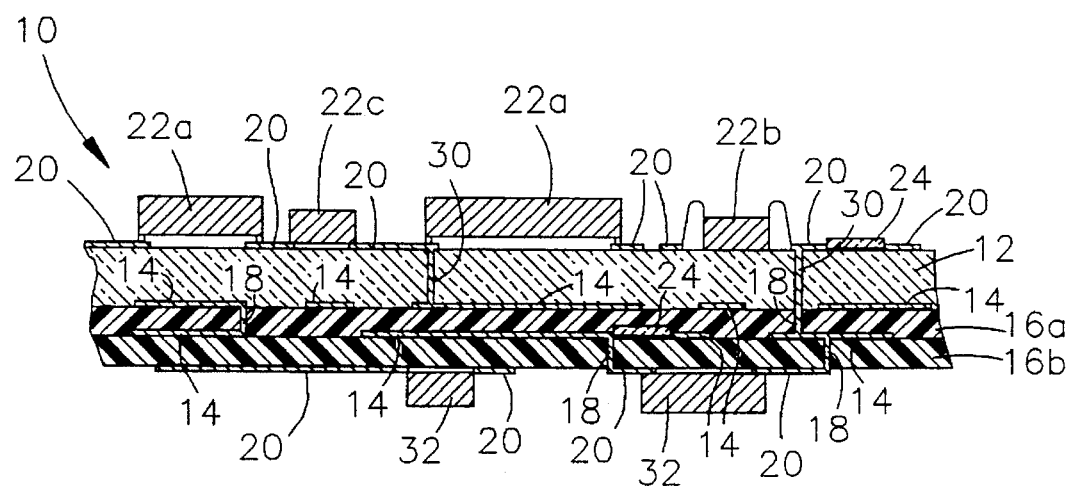

With reference to FIGS. 3 through 5, it can be seen that an added benefit to the hybrid circuit 10 of this invention is that thick film resistors 24 can also be readily formed within the multilayer structure or between the multilayer structure and the substrate 12. As a result, component density can be further promoted on the surface of the substrate 12 while heat conduction from the resistors 24 to the heat sink 26 is also enhanced.

The hybrid circuit 10 shown in FIG. 3 illustrates the inclusion of a thick film resistor 24 between the two dielectric layers 16a and 16b of the multilayer structure. With this location, the resistor 24 is printed after the last layer of runners 14 is formed on the backside of the substrate 12, and prior to depositing the last dielectric layer 16b. An advantage of this configuration is that the resistor 24 is placed very close to the heat sink 26, with only a single dielectric layer 16b and an adhesive separating the resistor 24 from the heat sink 26. As a result, thermal conduction between the resistor 24 and the heat sink 26 is enhanced, thereby lowering the operating temperature of the resistor 24 and minimizing the thermal effects on the multilayer structure. FIG. 4 illustrates a variation of the above, in which the thick film resistor 24 is printed directly on the backside of the substrate 12. With either approach, a greater number of resistors 24 can be integrated into the hybrid circuit 10, while simultaneously utilizing the topside of the substrate 12 for only those circuit devices (such as circuit devices 22a–c) that create the highest thermal stresses on the hybrid circuit 10.

A fourth embodiment of this invention is illustrated in FIG. 5. As is readily apparent, the heat sink 26 has been omitted from the hybrid circuit 10 of this embodiment, which allows for the placement of relatively low stress circuit devices 32, such as small low power integrated circuit chips and small passive circuit components, to be mounted on the backside of the hybrid circuit 10. Processing of this embodiment is substantially identical to that described for the hybrid circuit 10 of FIG. 2, with the exception that an additional printing and firing process is performed to form additional metal pads 20 on the exposed surface of the last dielectric layer 16b, and an additional solder print and reflow step is necessary to solder the circuit devices 32 to their respective metal pads 20. The above structure further maximizes component density of the hybrid circuit 10 when coupled with the buried thick film resistor 24 shown in FIG. 5.

Figure 1:
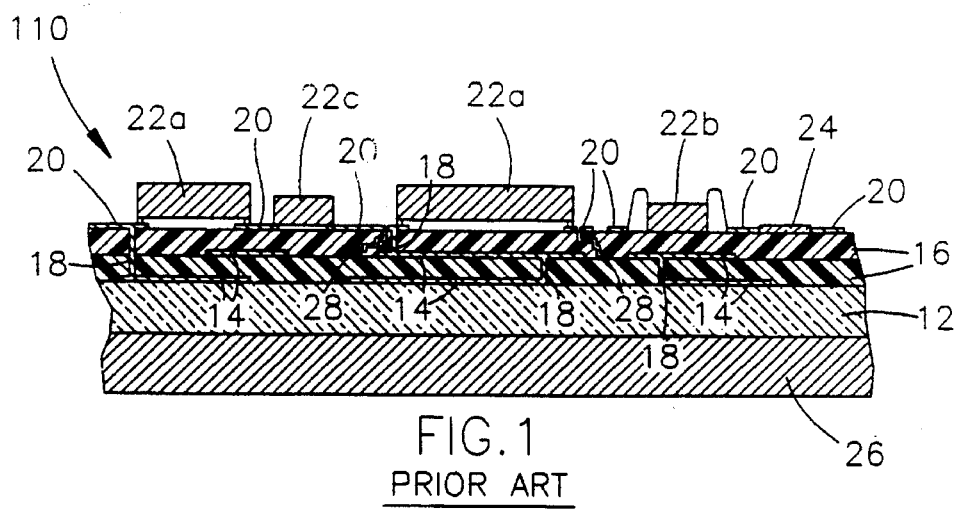
FIG. 1 shows, in cross-section, a prior art thick film hybrid multilayer circuit.

As with the first embodiment illustrated in FIG. 2, the embodiments of FIGS. 3 through 5 also incorporate the advantages made possible with this invention. Most notably, the multilayer structure is less susceptible to cracking due to the adverse effects of thermal cycling because the substrate 12 serves to thermally insulate the multilayer structure from localized hot spots created by the circuit devices 22a–c and 24, while also achieving a more uniform temperature gradient over the surface of the hybrid circuit 10. Lower operating temperatures are also made possible in accordance with the hybrid circuits of FIGS. 3 through 5. Furthermore, the circuit devices 22a–c can be more reliably bonded to the substrate 12 than to a dielectric layer of the multilayer structure when utilizing bonding techniques such as soldering. As such, the hybrid circuits 10 illustrated in FIGS. 3 through 5 offer enhanced reliability over those thick film hybrid multilayer circuits 110 known in the prior art, represented in FIG. 1. The hybrid circuits 10 of FIGS. 3 through 5 can also be formed using processing methods, such as printing, trimming, soldering and reflow techniques, which are widely known and used in the electronics industry. As a result, the hybrid circuits of this invention can be readily mass produced. Yet, an added benefit to the hybrid circuits of FIGS. 3 through 5 is that component density for the hybrid circuit 10 can be maximized, while also promoting heat conduction from the circuit devices 22a–c and 24.

While our invention has been described in terms of a preferred embodiment, it is apparent that other forms could be adopted by one skilled in the art—for example, by employing alternate processing techniques, or by substituting appropriate materials. Accordingly, the scope of our invention is to be limited only by the following claims.

The embodiments of the invention in which an exclusive property or privilege is claimed are defined as follows:

1. A thick film hybrid multilayer circuit comprising a substrate having a first surface and an oppositely disposed second surface;

a multilayer structure mounted to said first surface, said multilayer structure comprising multiple layers of conductors interlaid with multiple layers of an electrically insulating material;

circuit components supported by said second surface of said substrate, said circuit components being electrically interconnected with said multiple layers of conductors within said multilayer structure; and a heat sink abutted against said multilayer structure such that said multilayer structure is located between said substrate and said heat sink.

2. A thick film hybrid multilayer circuit comprising a substrate having a first surface and an oppositely disposed second surface;

a multilayer structure mounted to said first surface, said multilayer structure comprising multiple layers of conductors interlaid with multiple layers of an electrically insulating material;

circuit components supported by said second surface of said substrate, said circuit components being electrically interconnected with said multiple layers of conductors within said multilayer structure; and a thick film resistor located within said multilayer structure and electrically interconnected with a pair of conductors of said multiple layers of conductors.

3. A thick film hybrid multilayer circuit comprising a substrate having a first surface and an oppositely disposed second surface;

a multilayer structure mounted to said first surface, said multilayer structure comprising multiple layers of conductors interlaid with multiple layers of an electrically insulating material;

circuit components supported by said second surface of said substrate, said circuit components being electrically interconnected with said multiple layers of conductors within said multilayer structure; and a circuit component mounted to a surface of said multilayer structure opposite said substrate and electrically interconnected with a pair of conductors of said multiple layers of conductors.

4. A thick film hybrid multilayer circuit comprising a ceramic substrate having a first surface and an oppositely disposed second surface;

a multilayer structure mounted to said first surface, said multilayer structure comprising multiple layers of runners interlaid with multiple layers of a dielectric material;

circuit components supported by said second surface of said substrate such that heat generated by said circuit components is conducted to said substrate;

conductors extending through said substrate so as to electrically interconnect said circuit components with said multiple layers of runners; and a thick film resistor located within said multilayer structure and electrically interconnected with a pair of runners of said multiple layers of runners.

5. A thick film hybrid multilayer circuit comprising a ceramic substrate having a first surface and an oppositely disposed second surface;

a multilayer structure mounted to said first surface, said multilayer structure comprising multiple layers of runners interlaid with multiple layers of a dielectric material;

circuit components supported by said second surface of said substrate such that heat generated by said circuit components is conducted to said substrate:

conductors extending through said substrate so as to electrically interconnect said circuit components with said multiple layers of runners; and a thick film resistor positioned between said multilayer structure and said substrate, said thick film resistor being electrically interconnected with a pair of runners of said multiple layers of runners.

6. A thick film hybrid multilayer circuit comprising a ceramic substrate having a first surface and an oppositely disposed second surface;

a multilayer structure mounted to said first surface, said multilayer structure comprising multiple layers of runners interlaid with multiple layers of a dielectric material;

circuit components supported by said second surface of said substrate such that heat generated by said circuit components is conducted to said substrate;

conductors extending through said substrate so as to electrically interconnect said circuit components with said multiple layers of runners; and a heat sink abutted against said multilayer structure such that said multilayer structure is located between said substrate and said heat sink.

7. A thick film hybrid multilayer circuit comprising a ceramic substrate having a first surface and an oppositely disposed second surface;

a multilayer structure mounted to said first surface, said multilayer structure comprising multiple layers of runners interlaid with multiple layers of a dielectric material;

circuit components supported by said second surface of said substrate such that heat generated by said circuit components is conducted to said substrate;

conductors extending through said substrate so as to electrically interconnect said circuit components with said multiple layers of runners; and a circuit component mounted to a surface of said multilayer structure opposite said substrate and electrically interconnected with a pair of runners of said multiple layers of runners.

8. A thick film hybrid multilayer circuit comprising:

a ceramic substrate having a first surface and an oppositely disposed second surface;

a multilayer structure mounted to said first surface, said multilayer structure comprising multiple layers of runners interlaid with multiple layers of a dielectric material and an electrically insulating layer overlaying a surface of said multilayer structure opposite said substrate;

circuit components supported by said second surface of said substrate such that heat generated by said circuit components is conducted to said substrate;

a plurality of vias through said substrate, each of said plurality of vias having a metallized surface which electrically interconnects one of said circuit components with one of said multiple layers of runners; and a heat sink adhered to said electrically insulating layer of said multilayer structure such that said multilayer structure is located between said substrate and said heat sink;

whereby said substrate serves as a heat diffuser through which heat generated by said circuit components is more uniformly transmitted to said heat sink, so as to thermally insulate said multilayer structure from the adverse effects caused by thermal cycling during the operation of said thick film hybrid multilayer circuit.

9. A thick film hybrid multilayer circuit as recited in claim 8 further comprising a thick film resistor located within said multilayer structure and electrically interconnected with a pair of runners of said multiple layers of runners.

10. A thick film hybrid multilayer circuit as recited in claim 8 further comprising a thick film resistor located between said multilayer structure and said substrate, said thick film resistor being electrically interconnected with a pair of runners of said multiple layers of runners.

11. A thick film hybrid multilayer circuit as recited in claim 8 wherein the thermal resistance to heat conducted through said multilayer structure is greater than the thermal resistance through said substrate.

12. A thick film hybrid multilayer circuit as recited in claim 8 wherein said circuit components comprise integrated circuit chips.

13. A thick film hybrid multilayer circuit as recited in claim 8 wherein said circuit components comprise passive circuit devices.

* * * * *